United States Patent [19]
Breyta et al.

[11] Patent Number: 5,585,220
[45] Date of Patent: Dec. 17, 1996

[54] RESIST COMPOSITION WITH RADIATION SENSITIVE ACID GENERATOR

[75] Inventors: Gregory Breyta; Richard A. DiPietro, both of San Jose; Donald C. Hofer, San Martin; Hiroshi Ito, San Jose, all of Calif.

[73] Assignee: International Business Machines Corporation, Armonk, N.Y.

[21] Appl. No.: 566,025

[22] Filed: Dec. 1, 1995

[51] Int. Cl.$^6$ .................................................. G03F 7/004
[52] U.S. Cl. ........................ 430/270.1; 430/910; 430/914; 522/68
[58] Field of Search ................................ 430/270.1, 325, 430/326, 910, 914; 522/68

[56] References Cited

U.S. PATENT DOCUMENTS

| | | | |
|---|---|---|---|
| 4,450,360 | 5/1984 | Crivello et al. | 556/64 |
| 4,513,137 | 4/1985 | Koser et al. | 546/14 |
| 4,780,511 | 10/1988 | Crivello et al. | 525/353 |
| 5,286,901 | 2/1994 | Stang et al. | 562/40 |
| 5,374,500 | 12/1994 | Carpenter, Jr. et al. | 430/270.1 |
| 5,492,793 | 2/1996 | Breyta et al. | 430/270.14 |

*Primary Examiner*—John A. McPherson
*Attorney, Agent, or Firm*—Robert B. Martin

[57] ABSTRACT

The invention relates to a polymeric, radiation-sensitive resist composition comprising (i) iodonium sulfonate radiation sensitive acid generator; (ii) a polymer; and (iii) an acid labile compound.

1 Claim, No Drawings

RESIST COMPOSITION WITH RADIATION SENSITIVE ACID GENERATOR

FIELD OF THE INVENTION

The present invention relates to an improved resist composition having an ionic, radiation-sensitive acid generator.

BACKGROUND OF THE INVENTION

There is a desire in the industry for higher circuit density in microelectronic devices which are made using lithographic techniques. One method of increasing the number of components per chip is to decrease the minimum feature size on the chip. The use of shorter wavelength radiation (e.g. deep UV e.g. 190 to 315 nm) than currently employed mid-UV spectral range (e.g. 350 nm to 450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in Ito et al. U.S. Pat. No. 4,491,628 (Jan. 1, 1985) and Nalamasu et al., "An Overview of Resist Processing for Deep-UV Lithography", J. Photopolym Sci. Technol. 4, 299 (1991). The resist compositions generally comprise a photosensitive acid generator such as triphenylsulfonium triflate and an acid sensitive polymer. The polymer has acid sensitive side chain (pendant) groups which are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist to increase the quantum yield value above 1. The exposed polymer is soluble in polar developers such as alcohol and aqueous base while the unexposed polymer is soluble in nonpolar organic solvents such as anisole. Thus the resist can produce positive or negative images of the mask depending on the selection of the developer solvent.

Although these resist compositions generally have suitable lithographic sensitivity, their performance can be impaired in the presence of airborne basic chemical contaminants which are present in a manufacturing site. Recently, there has been developed a photosensitive resist which exhibits surprising stability in the presence of airborne chemical contaminants. The resist comprises a photosensitive acid generator and (ii) a polymer comprising hydroxystyrene and acrylate, methacrylate or a mixture of acrylate and methacrylate. The resist has high lithographic sensitivity and high thermal stability. However, there is a continuing desire in the industry to enhance the performance of resist compositions such as image resolution and process latitude.

It is therefore an object of the present invention to provide an improved chemically amplified resist composition for use in semiconductor manufacturing.

Other objects and advantages will become apparent from the following disclosure.

SUMMARY OF THE INVENTION

The present invention relates to a polymeric, radiation-sensitive resist composition comprising (i) iodonium sulfonate radiation sensitive acid generator; (ii) a polymer; and (iii) an acid labile compound.

The acid labile compound is preferably chemically bonded to the polymer. Upon exposure to acid, the acid labile compound undergoes a polarity change which results in dissolution differentiation. The acid labile compound is preferably a compound having an acid cleavable ester group. The resist has good solubility and adhesion, high lithographic sensitivity, high contrast and is solvent developable. The photoresist composition of the present invention is useful in semiconductor manufacturing to make integrated circuit chips. The present invention also relates to the process for making a resist image on a substrate using the resist composition of the present invention.

A more thorough disclosure of the present invention is presented in the detailed description which follows.

DETAILED DESCRIPTION OF THE INVENTION

The present invention relates to an acid catalyzed, chemically amplified, polymeric radiation-sensitive resist composition comprising (i) ionic iodonium sulfonate radiation sensitive acid generator; (ii) a polymer; and (iii) an acid labile compound.

The key feature of the present invention is the ionic iodonium sulfonate radiation sensitive acid generator. A preferred class of generator is the diaryl iodonium (alkyl or aryl) sulfonate having the formula.

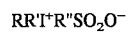

$$RR'I^+R''SO_2O^-$$

wherein R and R' are aryl such as phenyl optionally substituted with lower $C_{1-6}$ alkyl substituents and R" is $C_{1-10}$ alkyl, haloalkyl or cyclic alkyl or aryl such as phenyl optionally substituted with lower $C_{1-6}$ alkyl substituents. Preferred iodonium cations are bis(p-t-butylphenyl) iodonium, bis(p-tolyl) iodonium and bis(phenyl) iodonium. Preferred sulfonate anions are camphorsulfonate, p-methylbenzene sulfonate (tosyl anion) and trifluoromethane sulfonate.

The iodonium sulfonates of the present invention have high thermal stability e.g. thermally stable to a temperature >150° and also form acids upon exposure to radiation which have low volatility. The iodonium camphorsulfonate forms a weak acid upon exposure to radiation which is useful in certain applications.

The second component of the resist composition is a compound having an acid labile group.

Preferred acid labile groups are acid cleavable groups. The preferred acid cleavable groups are ester groups such as t-butyl and α-methylbenzyl esters of carboxylic acids and t-butylcarbonates of phenols. Other suitable acid labile groups include tetrahydropyranyl or furanyl ethers, trimethylsilyl or t-butyl(dimethyl)silyl ethers, and t-butoxycarbonylmethyl ether of phenol. However, it is understood that a wide range of acid labile groups are operative in the process of the present invention such as those disclosed in Ito et al. U.S. Pat. No. 4,491,628, the disclosure of which is incorporated herein by reference. Brunsvold et al., U.S. Pat. Nos. 4,931,379 (Jun. 5, 1990) and U.S. Pat. No. 4,939,070 (Jul. 3, 1990) disclose suitable thermally stable acid labile groups and associated polymer resists and the disclosure of Brunsvold is also incorporated herein by reference. The presence of acidic groups such as phenols or carboxylic acid groups in the film tends to thermally destabilize the acid labile group toward thermal cleavage. Certain acid labile groups may be unsuitable in the presence of phenolic or carboxylic acid groups due to their thermal and/or hydrolytic instability.

Preferably the acid labile compound is chemically bonded to the polymer. Suitable polymers are vinyl polymers.

The vinyl polymer is a polymer derived from vinyl monomer. The vinyl polymer can be a homopolymer, a copolymer or terpolymer. The vinyl polymer will generally have a number average molecular weight of about 5000 to about 50,000 and preferably be transparent in the U.V. suitably at least 30% transmission/micrometer at 248 nm and more preferably at least 50% transmission/micrometer at 248 nm and more preferably at least 65% transmission/ micrometer. Suitable base soluble vinyl polymers are poly-(hydroxystyrene), poly(vinylbenzoic acid), poly(acrylic add), poly(methacrylic acid), polymaleimide and copolymers thereof. The preferred polymers are (i) a copolymer comprising the reaction product of hydroxystyrene and acrylate or methacrylate and (ii) a copolymer comprising the reaction product of (i) acrylic acid, methacrylic acid, or mixtures thereof; and (ii) methacrylate, acrylate, or mixtures thereof.

In the preferred embodiment of the present invention, the polymer comprises acid labile groups pendant from the vinyl polymer backbone. The acid labile groups inhibit the dissolution of the polymer in alkaline developer or polar solvent. After imagewise exposure and heating, the photogenerated acid converts the acid labile group from dissolution-inhibiting to base-soluble functionality, thereby enabling image development of the film.

The process of the present invention for making a resist image on a substrate comprises three steps. The first step of the process involves coating the substrate with a polymeric film comprising (i) a radiation sensitive acid generator (ii) a polymer and (iii) an acid labile compound, all dissolved in a suitable solvent. Suitable substrates are comprised of silicon, ceramics, polymer or the like. Suitable organic casting solvents include diglyme, methyl cellosolve acetate, cyclohexanone, propylene glycol methyl ether acetate, ethyl lactate and the like. The film will preferably comprise about 80 to about 99.5 weight % of the polymer having pendant acid cleavable substituents (e.g. ester substituents) and about 20 to about 0.5 weight % of the acid generator both dissolved in the organic solvent.

Optionally, the film can contain additives such as polymers and small molecules to adjust the films dissolution rate, etch resistance, optical density, radiation sensitivity, adhesion and the like. The film can be coated on the substrate using art known techniques such as spin or spray coating, doctor blading or electrodeposition. After the film is coated on the substrate, it is generally heated to remove the solvent from the film.

In the second step of the process, the film is imagewise exposed to a low dose of radiation suitably electromagnetic or electron beam radiation preferably electromagnetic, preferably deep ultraviolet or x-ray more preferably deep ultraviolet radiation at a wavelength of about 190 to 315 nm more preferably at a wavelength of about 250 nm. Suitable radiation sources include mercury, mercury/xenon, and xenon lamps, excimer laser, electron beam or x-ray. Upon exposure acid is generated.

After the exposure, the film is preferably heated again to an elevated temperature. After exposure and heating, the side chain acid cleavable ester groups pendant from the polymer backbone are cleaved e.g. via a chemically amplified process, to form polar recurring units on the polymer backbone which are soluble in alkaline developer or polar solvents. The post-exposure heating enhances the cleavage of the ester groups. The cleavage of the ester groups alters the dissolution rate of the polymer and the resulting differential solubility between the exposed and unexposed areas of the film enables development of the image in the film.

The last step of the process of the present invention involves development of image in the film. Suitable development techniques are known to those skilled in the art. The image can be solvent developed preferably in an aqueous base solvent without metal ions such as aqueous tetraalkyl ammonium hydroxide to produce a positive tone image. The image in the film has high resolution and straight side walls.

After the substrate has been exposed by development, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Other means for forming circuits will be known by those skilled in the art.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Preparation of Bis-(p-t-Butyphenyl)iodoium Camphorsulfonate

To a 500 mL 4-necked Morton flask equipped with a mechanical stirrer, 125 mL addition funnel, thermocouple and argon inlet, was added 42.2 g (0.33 mol) of t-butylbenzene and 66 mL of acetic anhydride. The solution was stirred and 33 g (0.15 mol) of potassium iodate was added. The resulting suspension was cooled to 0° C. under argon. Meanwhile, to a 250 mL 3-necked round bottom flask equipped with an overhead stirrer, Ar inlet, thermocouple, and addition funnel was added 66 mL of acetic anhydride and the solution cooled in ice to 0° C. The addition funnel was charged with 21 mL of conc. $H_2SO_4$ which was then slowly dropwise over 1 hour maintaining a temperature <15° C. The resulting viscous solution was then transferred to the addition funnel on the Morton flask and added dropwise with vigorous stirring over 2 hours maintaining a temperature below 10° C. The orange suspension was then allowed to slowly warm to 22° C. overnight. The mixture was recooled to 0° C. and the addition funnel charged with 65 mL of water. The water was added very slowly at first, maintaining a temperature below 10° C. As the addition proceeded, it became possible to increase the flow rate and still maintain a temperature below 10° C. Once the addition was complete, 50 mL of ether was added in one portion and the mixture filtered through Celite. The water remaining in the filter bed was chased through with 50 mL of hexane. The filtrate was then washed with 6×150 mL of hexane. Meanwhile, to a 1000 mL 4-necked round bottom flask equipped with an overhead stirrer, a thermowell and a 500-mL addition funnel, was added 200 mL of water and 55.3 g (0.238 mol) of 10-camphorsulfonic acid. The flask was cooled in ice and the solution neutralized with 10.4 mL of conc. NH$_4$OH (14.8M). The addition funnel was then charged with the hexane-washed aqueous filtrate which was added dropwise over 1 hour with vigorous stirring. The white precipitate was filtered and air-dried overnight on the filter. The crude product was recrystallized from ethyl acetate/IPA to yield 54.8 g (58%) of the title compound as white flakes, mp 218°–220° C.(w/decomp.).

EXAMPLE 2

Resist Composition

A copolymer of t-butyl acrylate with p-hydroxystyrene (20 g) was dissolved in 100 g of propylene glycol methyl ether acetate, to which was added di(p-t-butylphenyl)iodonium camphorsulfonate at a concentration of 2.5% to the total solid. The solution was filtered (0.2μm).

EXAMPLE 3

Lithographic Results

The above resist composition was spin-coated onto 6" silicon wafers primed with hexamethyldisilazane. The resist film thus formed was baked at 150° C. for 60 sec. and exposed to a varying dose of 248 nm deep UV radiation on a Micrascan II. The exposed resist film was postbaked at 150° C. for 90 sec. and developed with a 0.26N tetramethylammonium hydroxide aqueous solution for 60 sec., followed by rinsing with water. Linear resolution to 225 nm was obtained at 6.25 mJ/cm$^2$ and the depth of focus for 250 nm line/space patterns was 1.2 μm.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A radiation sensitive resist composition comprising (i) bis (lower alkyl phenyl) iodonium camphorsulfonate and (ii) a copolymer comprising hydroxystyrene and acrylate or methacrylate having an acid clearable substituent.

* * * * *

UNITED STATES PATENT AND TRADEMARK OFFICE
CERTIFICATE OF CORRECTION

PATENT NO : 5,585,220
DATED : Dec. 17, 1996
INVENTOR(S): Breyta, DiPietro, Hofer, Ito It is certified that error appears in the above-identified patent and that said Letters Patent are hereby corrected as shown below:

Column 6, line 25: "clearable" should be "cleavable"

Signed and Sealed this

Eighth Day of May, 2001

NICHOLAS P. GODICI

*Attest:*

*Attesting Officer*    Acting Director of the United States Patent and Trademark Office